US012777737B2

(12) United States Patent
Lee

(10) Patent No.: US 12,777,737 B2
(45) Date of Patent: Oct. 27, 2026

(54) SEMICONDUCTOR DEVICE AND METHOD FOR MANUFACTURING THE SAME

(71) Applicant: SK hynix Inc., Icheon-si (KR)

(72) Inventor: Nam Jae Lee, Icheon-si (KR)

(73) Assignee: SK hynix Inc., Ickeon-si (KR)

( * ) Notice: Subject to any disclaimer, the term of this patent is extended or adjusted under 35 U.S.C. 154(b) by 359 days.

(21) Appl. No.: 18/582,648

(22) Filed: Feb. 21, 2024

(65) Prior Publication Data

US 2025/0120212 A1 Apr. 10, 2025

(30) Foreign Application Priority Data

Oct. 6, 2023 (KR) ........................ 10-2023-0133059

(51) Int. Cl.
*H10F 39/00* (2025.01)

(52) U.S. Cl.
CPC ......... *H10F 39/811* (2025.01); *H10F 39/018* (2025.01); *H10F 39/809* (2025.01)

(58) Field of Classification Search
CPC .... H10F 39/811; H10F 39/18; H10F 39/8053; H10F 39/8063; H10F 39/8067; H10F 39/809; H10F 39/018; H10F 39/199; H10F 39/813; H10F 39/026; H10F 39/8033; H10F 39/8037; H10N 50/10; H10W 20/40; H10W 72/90; H10W 90/00
See application file for complete search history.

(56) References Cited

U.S. PATENT DOCUMENTS

| | | | | |
|---|---|---|---|---|
| 9,780,136 | B2 * | 10/2017 | Kwon | H10F 39/809 |
| 2019/0103425 | A1 * | 4/2019 | Yoon | H10F 39/018 |
| 2019/0363130 | A1 * | 11/2019 | Yokoyama | H10F 39/024 |
| 2020/0194479 | A1 * | 6/2020 | Lee | H10F 39/014 |
| 2022/0130884 | A1 * | 4/2022 | Kim | H10F 39/018 |

FOREIGN PATENT DOCUMENTS

KR 10-2022-0056475 A 5/2022

* cited by examiner

*Primary Examiner* — Omar F Mojaddedi

(57) ABSTRACT

Disclosed is a method for manufacturing a semiconductor device, including: forming a first semiconductor structure comprising a logic transistor; forming a second semiconductor structure; bonding the first semiconductor structure to the second semiconductor structure, wherein forming the first semiconductor structure comprises: forming a first substrate; forming a first wiring layer comprising a plurality of first metal wirings and a plurality of first vias on the first substrate; forming a first bonding isolation layer on the first wiring layer, wherein forming the second semiconductor structure comprises: forming a second substrate; forming a second wiring layer comprising a plurality of second metal wirings and a plurality of second vias on the second substrate; forming a plurality of dummy plugs in the second wiring layer, forming a plurality of holes vertically penetrating the second substrate to a section in which the plurality of dummy plugs form, wherein the plurality of holes form after bonding the first semiconductor structure to the second semiconductor structure; and removing the dummy plugs.

16 Claims, 9 Drawing Sheets

SEMICONDUCTOR DEVICE AND METHOD FOR MANUFACTURING THE SAME

CROSS REFERENCE TO RELATED APPLICATION

The present application claims the priority and benefits of Korean Patent Application No. 10-2023-0133059, filed on Oct. 6, 2023, which is incorporated by reference in its entirety as part of the disclosure of the present application.

TECHNICAL FIELD

Various embodiments of the disclosed technology relate to a semiconductor device and a method for manufacturing the same, and more particularly, to a semiconductor device that bonds a lower wafer and an upper wafer to each other and a method for manufacturing the same.

BACKGROUND

In order to increase the degree of integration of semiconductor device, development of technologies of a stacked semiconductor device, which reduces an area of chips by integrating required circuits or components on two substrates, which are an upper substrate and a lower substrate, and bonding the two substrates to each other, is underway.

The components on the upper substrate and lower substrate bonded to each other should be electrically connected, and dielectric bonding or hybrid bonding is used for the electric connection.

SUMMARY

The disclosed technology can be implemented in some embodiments to provide a semiconductor device capable of minimizing dimension restrictions when connecting metal wirings of upper and lower wafers, and a method for manufacturing the same.

One embodiment is a method for manufacturing a semiconductor device, including: forming a first semiconductor structure comprising a logic transistor; forming a second semiconductor structure; bonding the first semiconductor structure to the second semiconductor structure, wherein forming the first semiconductor structure comprises: forming a first substrate; forming a first wiring layer comprising a plurality of first metal wirings and a plurality of first vias on the first substrate; forming a first bonding isolation layer on the first wiring layer, wherein forming the second semiconductor structure comprises: forming a second substrate; forming a second wiring layer comprising a plurality of second metal wirings and a plurality of second vias on the second substrate; forming a plurality of dummy plugs in the second wiring layer, forming a plurality of holes vertically penetrating the second substrate to a section in which the plurality of dummy plugs form, wherein the plurality of holes form after bonding the first semiconductor structure to the second semiconductor structure; and removing the dummy plug.

The forming the plurality of dummy plugs may include forming the plurality of dummy plugs in a vertical direction from an upper part of the second wiring layer to an upper part of the second substrate.

The method for manufacturing a semiconductor device may further include: forming a plurality of second metal wirings in an upper part of the second wiring layer comprising an upper region of the plurality of dummy plugs, and forming a plurality of punch holes vertically penetrating the plurality of second metal wirings formed in the upper region of the dummy plug.

The method for manufacturing a semiconductor device may further include: forming a plurality of dummy plugs additionally in an internal space of the punch holes of the second semiconductor structure.

The method for manufacturing a semiconductor device may further include: forming a second bonding isolation layer on the second wiring layer after forming the plurality of dummy plugs additionally in an internal space of the punch holes of the second semiconductor structure.

The bonding the first semiconductor structure to the second semiconductor structure may include bonding the first bonding isolation layer to the second bonding isolation layer.

The method for manufacturing a semiconductor device may further include: forming a plurality of third vias by etching a first capping nitride layer, the first bonding isolation layer, and the second bonding isolation layer formed on the plurality of first metal wirings after removing the dummy plug.

The method for manufacturing a semiconductor device may further include: forming a spacer oxide layer on a sidewall of the plurality of third vias.

The method for manufacturing a semiconductor device may further include: etching the spacer oxide layer formed on a boundary plane between the plurality of third vias and the plurality of first metal wirings.

The method for manufacturing a semiconductor device may further include: forming a barrier metal layer on the second substrate, the spacer oxide layer, and the plurality of first metal wirings.

The method for manufacturing a semiconductor device may further include: forming an amorphous carbon layer on the barrier metal layer.

The method for manufacturing a semiconductor device may further include: forming a plurality of contact plugs inside the plurality of third vias after the amorphous carbon layer is formed.

The method for manufacturing a semiconductor device may further include: removing the amorphous carbon layer after the plurality of contact plugs are formed.

The method for manufacturing a semiconductor device may further include: removing the barrier metal layer formed in an upper region of the second substrate, among the barrier metal layer after the amorphous carbon layer is removed.

The method for manufacturing a semiconductor device may further include: forming a pixel array on the second substrate after the barrier metal layer is removed.

The forming pixel array on the second substrate comprises a photodiode, an isolation layer, a color filter, and a microlens.

Another embodiment is a semiconductor device. The semiconductor device may include a first semiconductor structure comprising a first substrate, a first isolation layer formed on the first substrate and in which a first wiring structure is embedded, and a first bonding isolation layer formed on the first isolation layer; a second semiconductor structure comprising a second substrate, a second isolation layer formed below the second substrate and in which a second wiring structure is embedded, and a second bonding isolation layer formed below the second isolation layer and bonded to the first bonding isolation layer; a through electrode formed to penetrate the second substrate, the second isolation layer, the second bonding isolation layer, and the first bonding isolation layer and connected to first conductive patterns formed on top of the first isolation layer; and a metal pattern formed to surround at least a portion of a sidewall of a part of the through electrode formed between the second substrate and the second bonding isolation layer.

The first wiring structure may include a plurality of first conductive patterns and a plurality of first vias.

The second wiring structure may include a plurality of second conductive patterns and a plurality of second vias.

DETAILED DESCRIPTION

Features, and certain advantages in connection with specific implementations of the disclosed technology disclosed in the present application are described by example embodiments with reference to the accompanying drawings.

When using the dielectric bonding process, the films accumulated during formation of a metal line, a transistor (TR), and a through silicon via (TSV) penetrating the upper wafer, should be etched, and therefore, there occurs a problem of limitation on a contact size and layout.

Use of the hybrid bonding process may overcome the arrangement limitation. However, problems of cost increase and influence to yield occur. In some implementations, it is possible to minimize dimension restrictions when connecting metal wirings of the upper and lower wafers, by disposing a dummy plug in one region of the upper wafer requiring the upper and lower wafer connection, removing the dummy plug during wafer bonding and a TSV process, and performing an additional etching so as to form a butting contact. In some implementations, by applying dielectric bonding, the cost can be reduced compared to the hybrid bonding.

In some implementations, it is possible to minimize dimension restrictions when connecting metal wirings of the upper and lower wafers, by disposing a dummy plug in one region of the upper wafer requiring the upper and lower wafer connection, removing the dummy plug during wafer bonding and a TSV process, and performing an additional etching so as to form a butting contact. In some implementations, by applying dielectric bonding, the cost can be reduced compared to the hybrid bonding.

Figure 1:
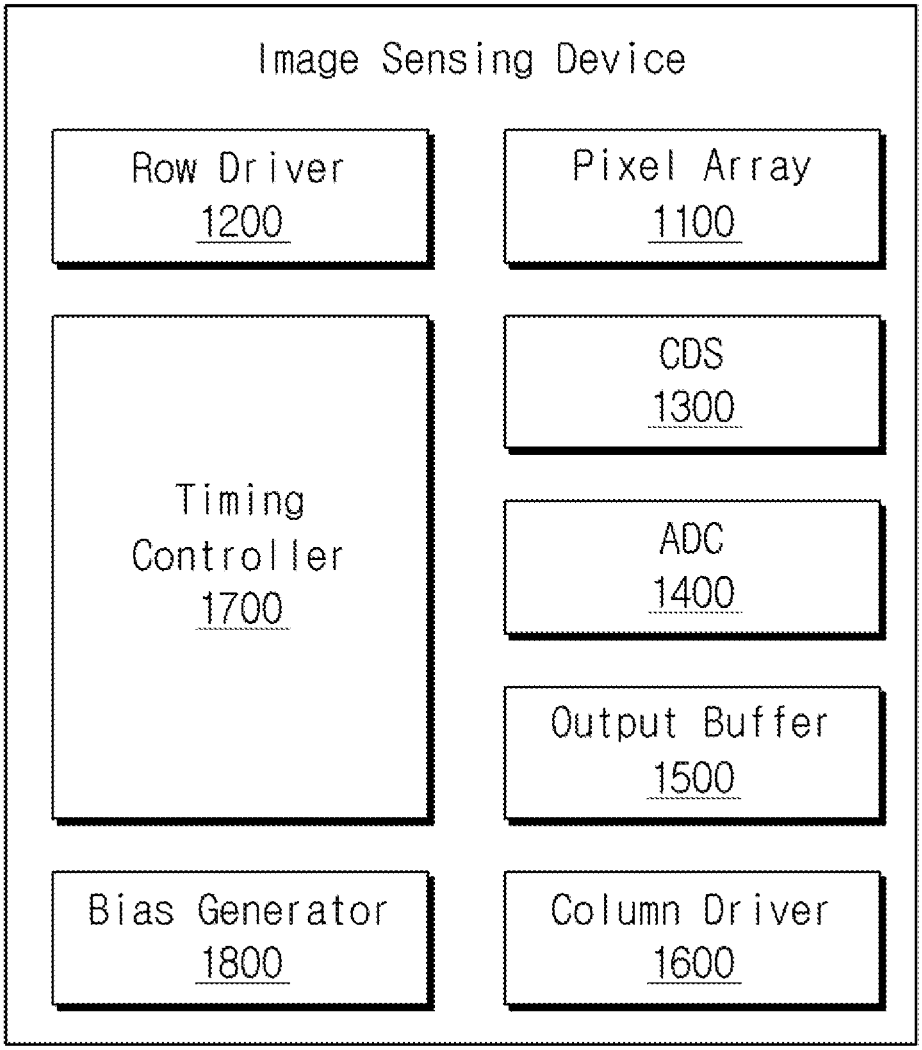
FIG. 1 is a block diagram of an image sensing device according to an embodiment of the present disclosure.

FIG. 1 is a block diagram of an image sensing device according to an embodiment of the present disclosure.

Referring to FIG. 1, the image sensing device according to an embodiment may include a pixel array 1100, a row driver 1200, a correlated double sampler (CDS) 1300, an analog-digital converter (ADC) 1400, an output buffer 1500, a column driver 1600, a timing controller 1700, and a bias generator 1800. The components of the image sensing device illustrated are discussed by way of example only, and the present application encompasses additions or omissions of components as necessary.

The pixel array 1100 may include a plurality of pixels arranged in a plurality of rows and a plurality of columns. In an embodiment, the plurality of pixels can be arranged in a two-dimensional pixel array including rows and columns. In another example, the plurality of unit imaging pixels can be arranged in a three-dimensional pixel array. The plurality of pixels may convert an optical signal into an electrical signal on a unit pixel basis or on a pixel group basis and the pixels in a pixel group share at least certain internal circuitry. The pixel array 1100 may receive driving signals, including a row selection signal, a pixel reset signal and a transmission signal, from the row driver 1200. Upon receiving the driving signal, corresponding pixels in the pixel array 1100 may be activated to perform operations corresponding to the row selection signal, the pixel reset signal, and the transmission signal.

The row driver 1200 may activate the pixel array 1100 to perform certain operations on the pixels in the corresponding row based on commands and control signals provided by the timing controller 1700. In an embodiment, the row driver 1200 may select at least one pixel arranged in at least one row of the pixel array 1100. The row driver 1200 may generate a row selection signal to select at least one row among the plurality of rows. The row driver 1200 may sequentially enable the pixel reset signal and the transmission signal for the pixels corresponding to the at least one selected row. Thus, a reference signal and an image signal, which are analog signals generated by each of the pixels of the selected row, may be sequentially transferred to the correlated double sampler (CDS) 1300. At this time, the reference signal may be an electrical signal that is provided to the correlated double sampler (CDS) 1300 when a sensing node of a pixel (e.g., floating diffusion node) is reset, and the image signal may be an electrical signal that is provided to the correlated double sampler (CDS) 1300 when photocharges generated by the pixel are accumulated in the sensing node. A reference signal representing reset noise inherent in a pixel and an image signal representing intensity of incident light may be collectively referred to as a pixel signal.

Complementary Metal Oxide Semiconductor (CMOS) image sensors may use the correlated double sampler (CDS) to remove undesired offset values of pixels known as the fixed pattern noise by sampling a pixel signal twice to remove the difference between these two samples. In some embodiments, the correlated double sampler (CDS) may remove the undesired offset value of pixels by comparing pixel output voltages obtained before and after photocharges generated by incident light are accumulated in the sensing node so that only pixel output voltages based on the incident light can be measured. In one embodiment, the correlated double sampler (CDS) 1300 may sequentially sample and hold the reference signal and the image signal, which are provided to each of a plurality of column lines from the pixel array 1100. That is, the correlated double sampler (CDS) 1300 may sample and hold the reference signal and the image signal which correspond to each of the columns of the pixel array 1100.

The correlated double sampler (CDS) 1300 may transfer the reference signal and the image signal of each of the columns as a correlated double sampling signal to the analog-digital converter (ADC) 1400 based on control signals from the timing controller 1700.

The analog-digital converter (ADC) 1400 is used to convert the correlated double sampler (CDS) signals into digital signals for each of the columns and output the digital signal. In one embodiment, the analog-digital converter (ADC) 1400 may be implemented as a ramp-compare type analog-digital converter (ADC). The ramp-compare type analog-digital converter (ADC) may include a comparator circuit for comparing the analog pixel signal with a ramp signal that ramps up or down over time, and a counter that counts until the ramp signal matches the analog pixel signal. In one embodiment, the analog-digital converter (ADC)

1400 may convert the correlated double sampling signal generated by the correlated double sampler (CDS) 1300 for each of the columns into a digital signal, and output the digital signal.

The analog-digital converter (ADC) 1400 may include a plurality of column counters corresponding to each of the columns of the pixel array 1100. Each column of the pixel array 1100 is coupled to a column counter, and image data can be generated by converting the correlated double sampling signals corresponding to each of the columns into digital signals using the column counters. In another embodiment of the disclosed technology, the analog-digital converter (ADC) 1400 may include a global counter to convert the correlated double sampling signals corresponding to each of the columns into digital signals using a global code provided from the global counter.

The output buffer 1500 may temporarily hold the column-based image data provided from the analog-digital converter (ADC) 1400 to output the image data. The output buffer 1500 may temporarily store the image data output from the analog-digital converter (ADC) 1400 based on control signals of the timing controller 1700. The output buffer 1500 may serve as an interface to compensate for data rate differences or transmission (or processing) rate differences between the image sensing device and other devices.

The column driver 1600 may select a column of the output buffer 1500 based on a control signal from the timing controller 1700, and sequentially output the image data, which are temporarily stored in the selected column of the output buffer 1500. In one embodiment, upon receiving an address signal from the timing controller 1700, the column driver 1600 may generate a column selection signal based on the address signal and select a column of the output buffer 1500, outputting the image data as an output signal from the selected column of the output buffer 1500.

The timing controller 1700 may control at least one among the row driver 1200, the correlated double sampler (CDS) 1300, the analog-digital converter (ADC) 1400, the output buffer 1500, the column driver 1600, and the bias generator 1800.

The timing controller 1700 may provide a clock signal required for the operations of the respective components of the image sensing device, a control signal for timing control, and address signals for selecting a row or column, a signal that controls a level of a bias voltage applied to the pixel array 1100, and the like to at least one among the row driver 1200, the correlated double sampler (CDS) 1300, the analog-digital converter (ADC) 1400, the output buffer 1500, the column driver 1600 and the bias generator 1800. In an embodiment of the present disclosure, the timing controller 1700 may include a logic control circuit, a phase lock loop (PLL) circuit, a timing control circuit, a communication interface circuit, and others.

The bias generator 1800 may generate a bias voltage for suppressing a dark current generated in pixels of the pixel array 1100 and supply the generated bias voltage to the pixel array 1100.

The bias voltage may be determined during a wafer probe test of the image sensing device and stored in a one-time programmable (OTP) memory. For example, the bias voltage may be experimentally determined as a value capable of maximizing a dark current suppression effect while minimizing unnecessary power consumption without impairing performance of the image sensing device.

The bias generator 1800 may generate a voltage corresponding to the bias voltage stored in the one-time programmable (OTP) memory. According to an embodiment, the one-time programmable (OTP) memory may be included in the image sensing device, and in particular, may be included in the bias generator 1800.

According to an embodiment, the bias voltage may include a plurality of values.

For example, the plurality of values may respectively correspond to a plurality of operation modes of the image sensing device. The dark currents generated at low light and that generated at high light may be different from each other, and the bias voltage provided by the bias generator 1800 to effectively suppress the dark currents in each environment may vary depending on a mode.

Alternatively, the plurality of values may respectively correspond to a plurality of areas of the pixel array 1100. The dark currents generated may be different from each other according to positions of the pixel in the pixel array 1100, and the bias voltage provided by the bias generator 1800 to effectively suppress the dark current regardless of the position of the pixel may vary according to the area.

The bias voltage may be a negative voltage having a negative sign, but the present disclosure is not limited thereto.

FIGS. 2 to 15 are views for describing a method for manufacturing a semiconductor device according to an embodiment of the present disclosure.

A method for manufacturing a semiconductor device according to an embodiment of the present disclosure may include: forming a first semiconductor structure 100 including a logic transistor; forming a second semiconductor structure 200 bonded to the first semiconductor structure 100; and bonding the first semiconductor structure 100 and the second semiconductor structure 200 to each other.

In an embodiment of the present disclosure, the first semiconductor structure 100 may be a logic wafer which includes logic transistors such as the row driver, the correlated double sampler (CDS), the analog-digital converter (ADC), the output buffer, the column driver, the timing controller, and the bias generator.

In an embodiment of the present disclosure, the second semiconductor structure 200 may be a pixel wafer which includes a pixel array.

Figure 2:
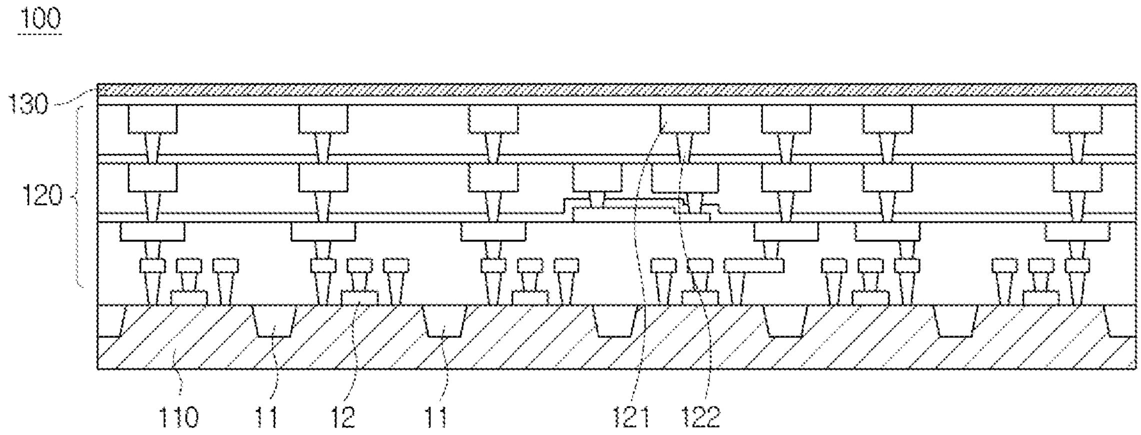
FIGS. 2 to 15 are views for describing a method for manufacturing a semiconductor device according to an embodiment of the present disclosure.

FIG. 2 is a cross-sectional view schematically illustrating a first semiconductor structure. Referring to FIG. 2, the forming of a first semiconductor structure 100 may include: forming a first substrate 110; forming a first wiring layer (or first isolation layer) 120 including a plurality of first metal wirings (or first conductive patterns) 121 and a plurality of first vias 122 on the first substrate 110; and forming a first bonding isolation layer 130 on the first wiring layer 120.

The first substrate 110 may include a semiconductor substrate. The semiconductor substrate may be in a single crystal state, and may include a silicon-containing material.

The first substrate 110 may be a substrate which has been thinned through a thinning process (wafer thinning process). In an embodiment of the present disclosure, the first substrate 110 may be a bulk silicon substrate which has been thinned through the thinning process. In an embodiment of the present disclosure, the first substrate 110 may include p-type impurities (or n-type impurities).

The first wiring layer 120 may be formed on the first substrate 110, and may include a device isolation layer 11, a plurality of junction regions (not illustrated) and gate electrodes 12, the plurality of first metal wirings 121, and the plurality of first vias 122.

The device isolation layer 11 may isolate neighboring transistors electrically from each other, and may include an insulation material.

The junction region (not illustrated) may include one among a n-type region which includes n-type impurity ions such as phosphorous (P) or arsenic (As), or a p-type region which includes p-type impurity ions such as boron (B).

The gate electrode 12 may include a conductive material such as metal, or doped polysilicon.

The plurality of junction regions (not illustrated) may be used as drain electrodes and/or source electrodes of the logic transistor.

Various logic transistors may be formed through the plurality of junction regions (not illustrated) and gate electrodes 12. The plurality of logic transistors may form various logic circuits.

The plurality of first metal wirings 121 and the plurality of first vias 122 may include a conductive material such as metal, or doped polysilicon. In an embodiment of the present disclosure, the plurality of the first metal wirings 121 and the plurality of first vias 122 may include metals such as tungsten (W), copper (Cu), aluminum (Al), and titanium (Ti), a metal compound such as a titanium nitride (TiN), or a metal silicide such as a tungsten silicide (WSI) or a titanium silicide (TISi).

Electrical signals may be transferred between vertical layers through the plurality of first vias 122.

The first bonding isolation layer 130 may be formed on the first wiring layer 120.

The first bonding isolation layer 130 may be formed through processes of oxide deposition and chemical mechanical polishing (CMP).

Figure 3:
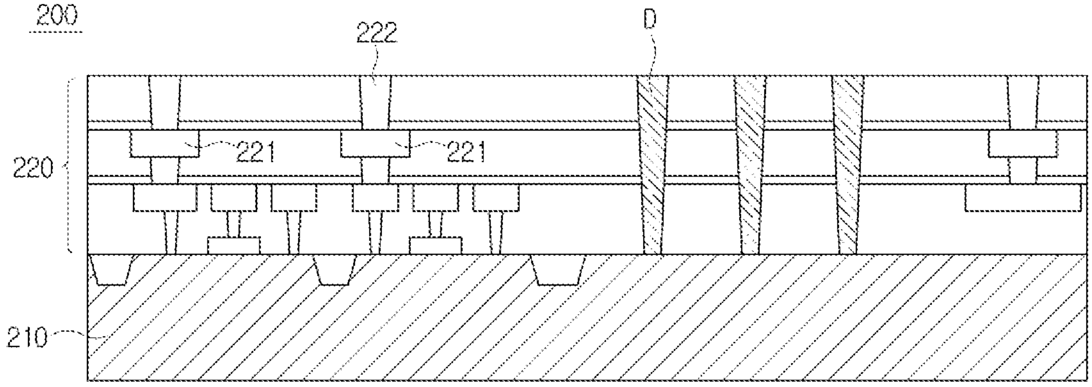

FIG. 3 is a cross-sectional view schematically illustrating a second semiconductor structure. Referring to FIG. 3, the forming of a second semiconductor structure 200 may include forming a second substrate 210, forming a second wiring layer (or second isolation layer) 220 including a plurality of second metal wirings (or second conductive patterns) 221 and a plurality of second vias 222 on the second substrate 210, and forming a dummy plug D in one region of the second wiring layer 220.

The second substrate 210 may include a semiconductor substrate. The semiconductor substrate may be in a single crystal state, and may include a silicon-containing material.

The second substrate 210 may be a substrate which has been thinned through a thinning process. In an embodiment of the present disclosure, the second substrate 210 may be a bulk silicon substrate which has been thinned through the thinning process. In an embodiment, the second substrate 210 may include p-type impurities (or n-type impurities).

The plurality of second metal wirings 221 and the plurality of second vias 222 may include a conductive material such as metal, or doped polysilicon. In an embodiment, the plurality of the second metal wirings 221 and the plurality of second vias 222 may include metal such as tungsten (W), copper (Cu), aluminum (Al), and titanium (Ti), a metal compound such as a titanium nitride (TiN), or a metal silicide such as a tungsten silicide (WSI) or a titanium silicide (TISi).

Electrical signals may be transferred between vertical layers through the plurality of second vias 222.

Referring to FIG. 3, the dummy plug D may be formed in one region of the second wiring layer 220 through processes of forming patterns using a contact mask, etching, and deposition. The dummy plug D may include a conductive metal material. The dummy plug D may be formed in a vertical direction from an upper part of the one region of the second wiring layer 220 to an upper part of the second substrate 210.

Figure 4:
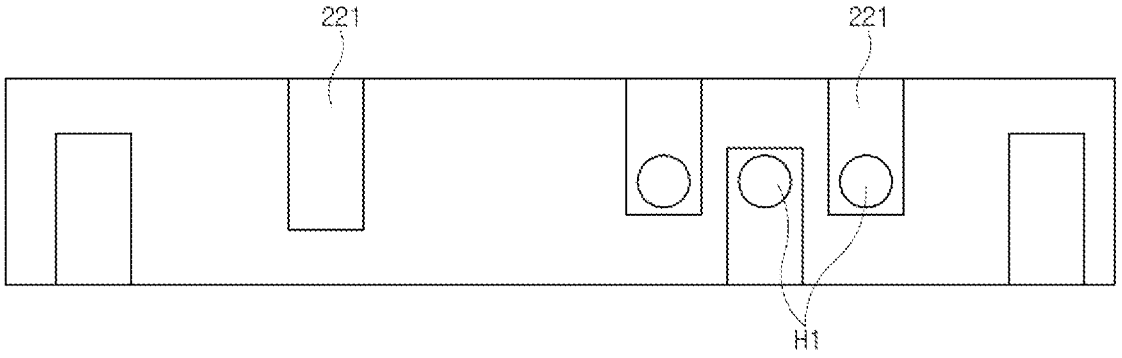
Figure 5:
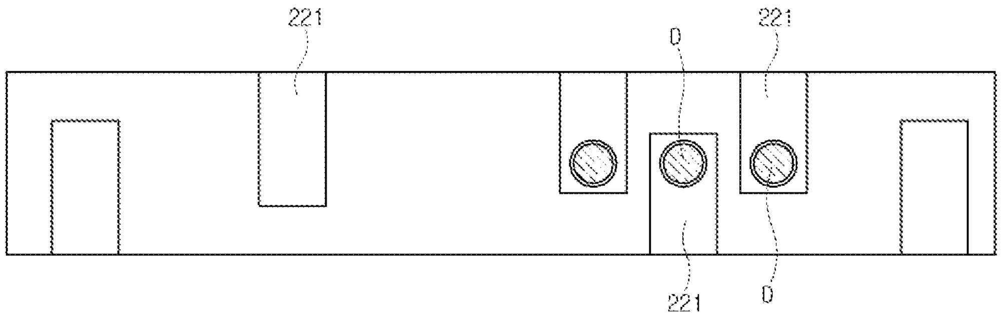

FIGS. 4 and 5 are top views of the lower layer according to an embodiment of the present disclosure.

Figure 6:
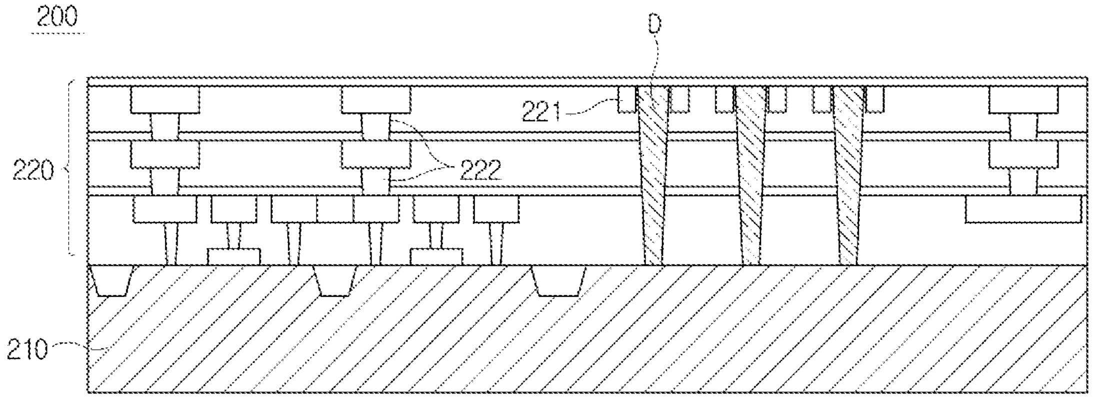

Referring to FIGS. 4 to 6, the second metal wiring 221 may be formed in an upper region of the second wiring layer 220 through processes of forming patterns using a metal mask, etching, and deposition.

Referring to FIG. 4, FIG. 4 shows the forming of a plurality of punch holes H1 vertically penetrating the second metal wiring 221 formed in an upper region of the dummy plug D of the second wiring layer 220.

Referring to FIGS. 5 and 6, after forming the punch holes H1, the dummy plug D may be additionally formed in an internal space of the punch holes H1 through processes of formation of barrier metal BM and deposition of a conductive metal material.

Figure 7:
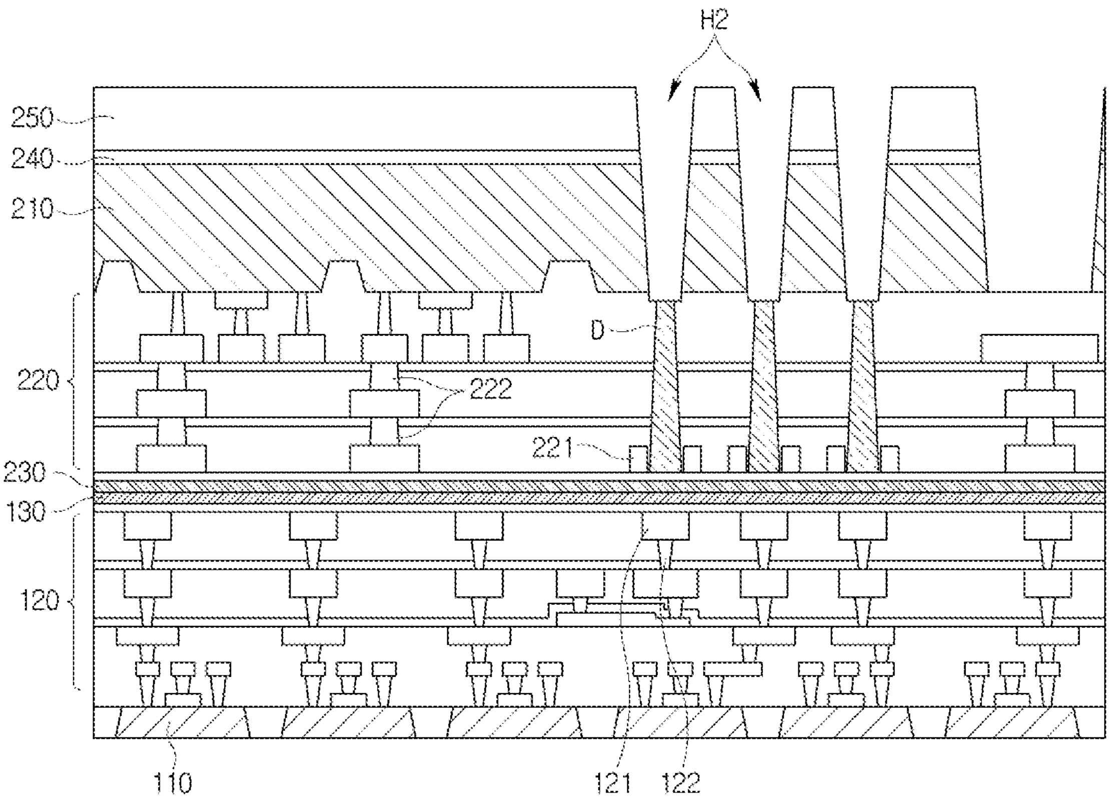

Referring to FIG. 7, after forming the dummy plug D, a second bonding isolation layer 230 may be formed on the second wiring layer 220.

The second bonding isolation layer 230 may be formed through processes of oxide deposition and chemical mechanical polishing (CMP).

Referring to FIG. 7, after forming the second bonding isolation layer 230, the first bonding isolation layer 130 of the first semiconductor structure 100 and the second bonding isolation layer 230 of the second semiconductor structure 200 may be dielectrically bonded to each other.

By applying the dielectric bonding, the cost may be reduced compared with a case to which hybrid bonding is applied.

Referring to FIG. 7, after bonding the first bonding isolation layer 130 and the second bonding isolation layer 230 to each other, a hole H2 may be formed from a photoresist layer 250 to a section in which the dummy plug D is formed, through an etching process using a TSV (through-silicon via) mask.

The hole H2 may be formed to vertically penetrate a passivation layer 240, and the second substrate 210.

Referring to FIGS. 4, 5, and 7, the dummy plug D may be formed in the second wiring layer 220, and may be formed in a vertical direction from the second metal wiring 221 adjacent to the second bonding isolation layer 230, among the plurality of second metal wirings 221, to a region adjacent to the second substrate 210. In the second metal wiring 221 adjacent to the second bonding isolation layer 230, the punch holes H1 which vertically penetrate may be formed, and the dummy plug D may be formed in an internal space of the punch hole H1.

Figure 8:
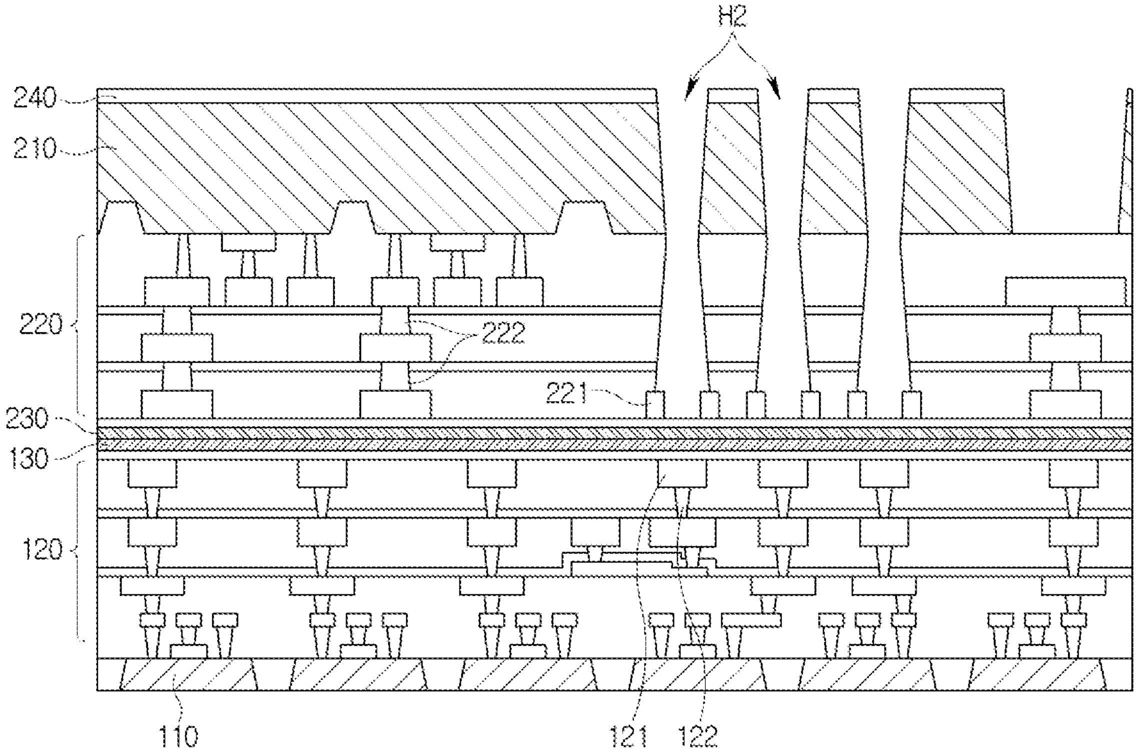

Referring to FIG. 8, after forming a hole H2 vertically penetrating the second substrate 210, the photoresist layer 250 may be removed and the dummy plug D may be removed through processes of photo resist strip and etching.

In a subsequent process, an oxide dip-out may be performed to connect a butting contact.

Figure 9:
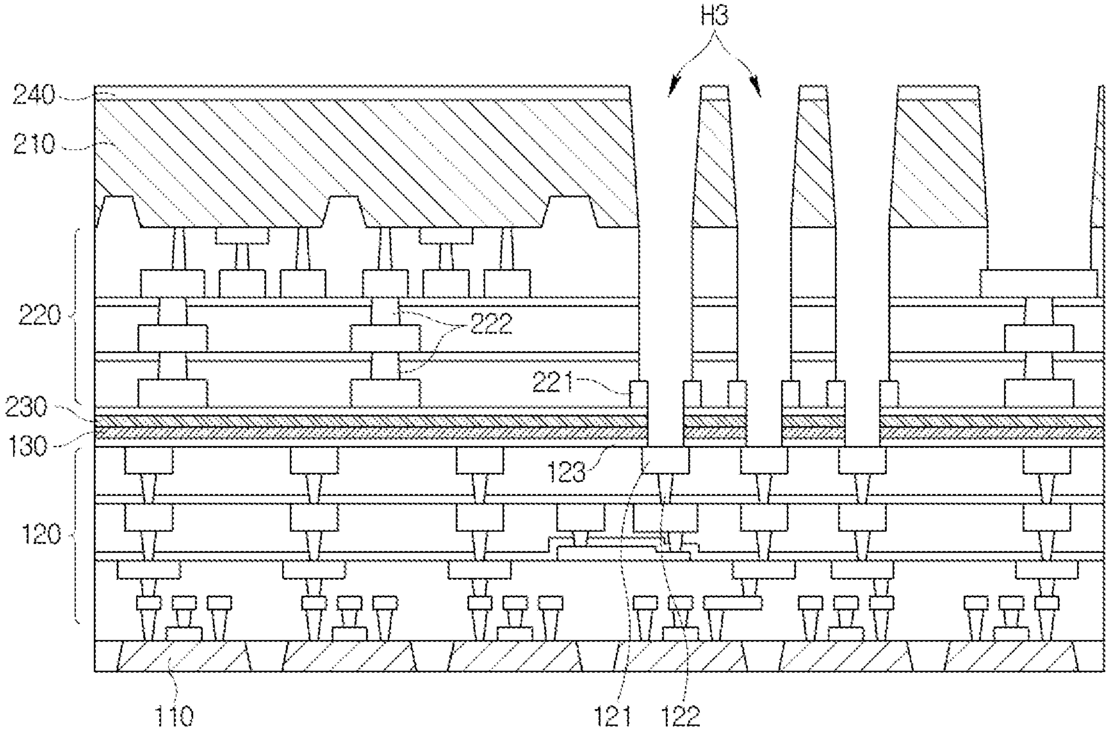

Referring to FIG. 9, after removing the dummy plug D, a third via H3 may be formed by etching a first capping nitride layer 123, the first bonding isolation layer 130, and the second bonding isolation layer 230 which are formed on the first metal wiring 121.

Figure 10:
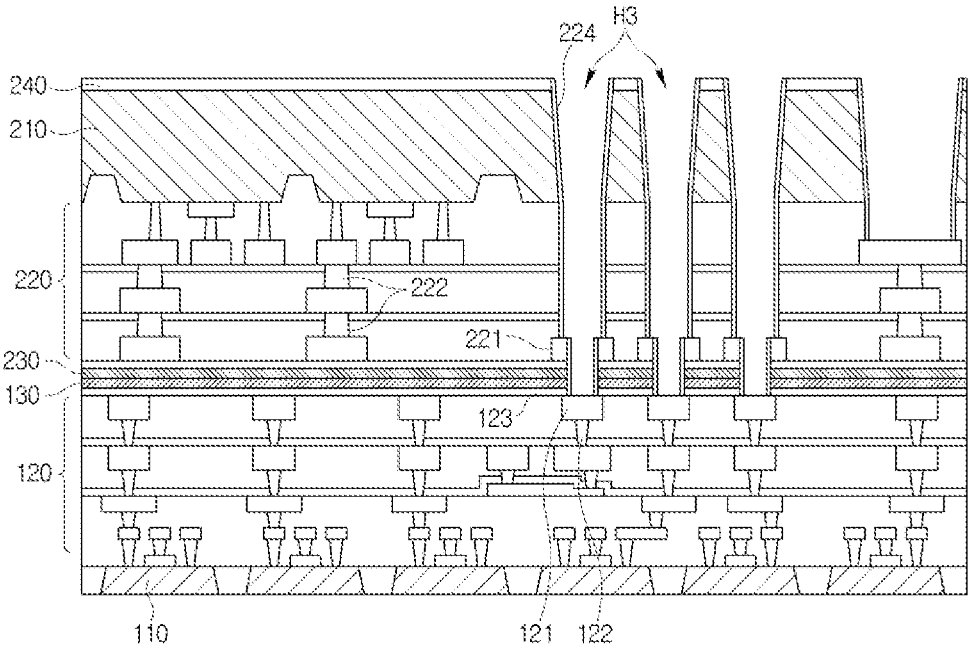

Referring to FIG. 10, after forming the third via H3, a spacer oxide layer 224 may be formed on a sidewall of the third via H3.

After forming the spacer oxide layer 224, the spacer oxide layer 224 formed on a boundary plane between the third via H3 and the first metal wiring 121 may be etched.

Figure 11:
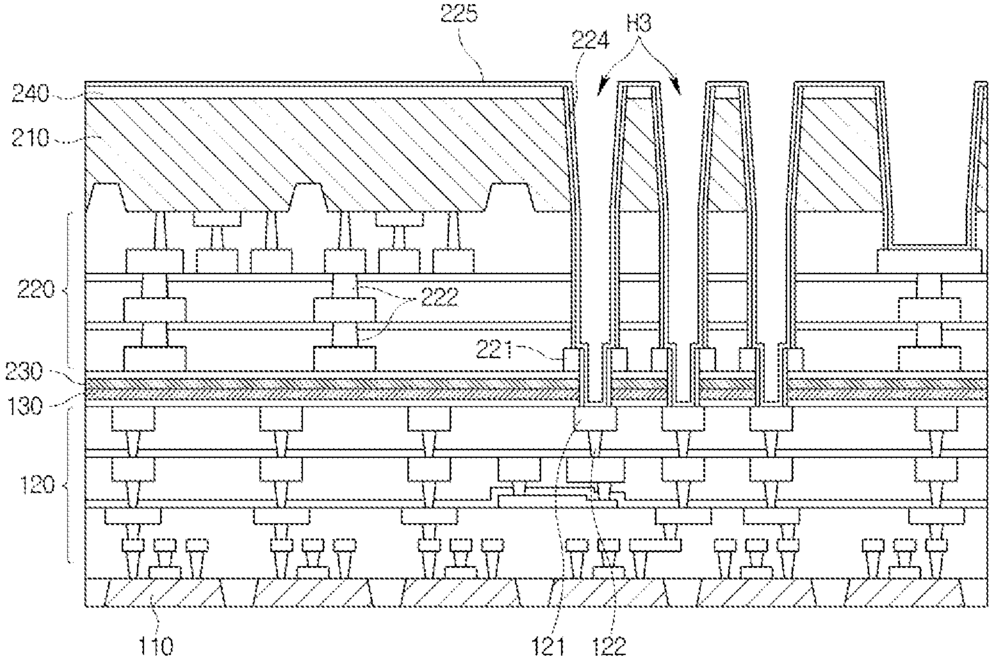

Referring to FIG. 11, after etching the spacer oxide layer 224 below the third via H3, a barrier metal layer (or metal pattern) 225 may be formed on the passivation layer 240, the spacer oxide layer 224, and the first metal wiring 121.

Figure 12:
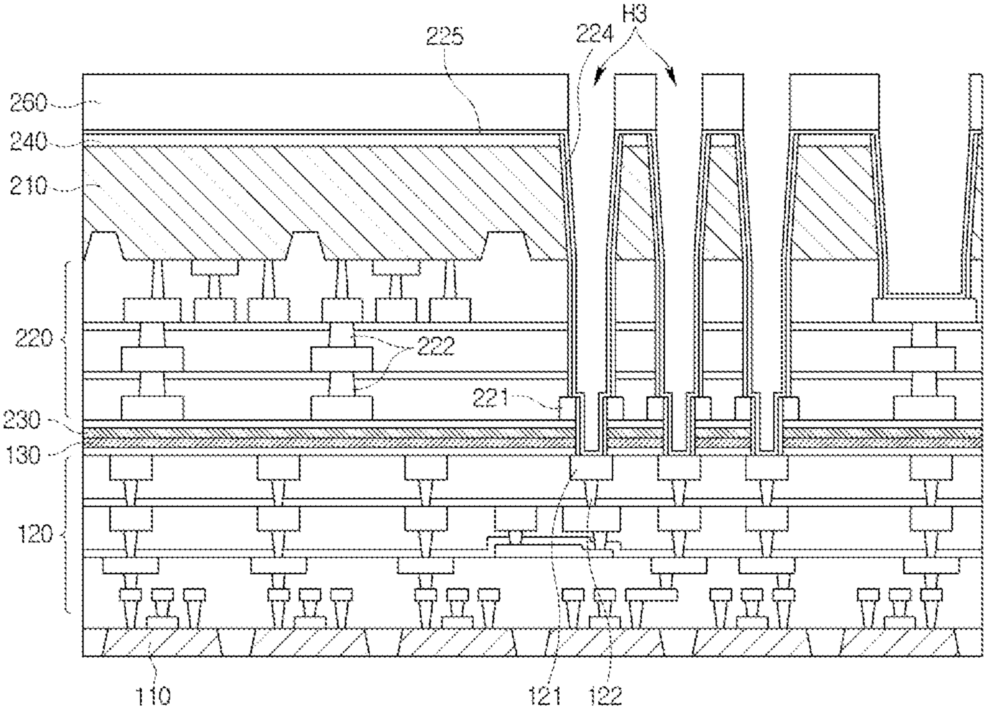

Referring to FIG. 12, after forming the barrier metal layer 225, an amorphous carbon layer (ACL) 260 may be formed on the barrier metal layer 225, and the amorphous carbon layer 260 on the sidewall of the third via H3 and below the third via H3 may be removed.

Figure 13:
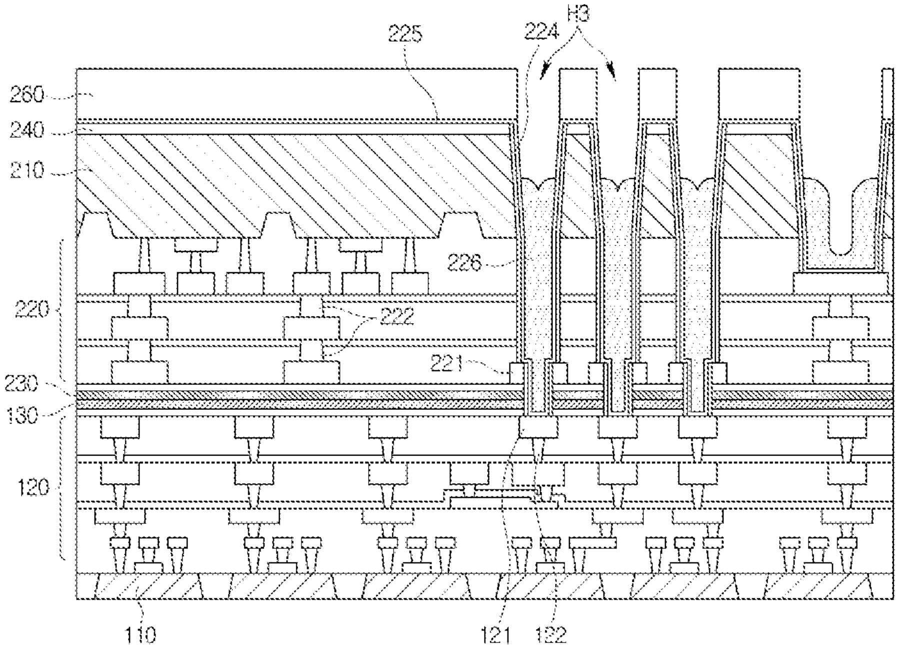

Referring to FIG. 13, after removing the amorphous carbon layer 260, a contact plug (or a through electrode) 226 may be formed inside the third via H3.

In an embodiment, the contact plug 226 may include copper (Cu). It is possible to deposit the copper (Cu) only in a region in which seed copper (Cu) is exposed.

By forming a butting contact through removal of the dummy plug and execution of an additional etching when performing wafer bonding and TSV, the dimension restrictions may be minimized during connection of metal wirings of the first semiconductor structure (or an upper wafer) and the second semiconductor structure (or a lower wafer).

Figure 14:
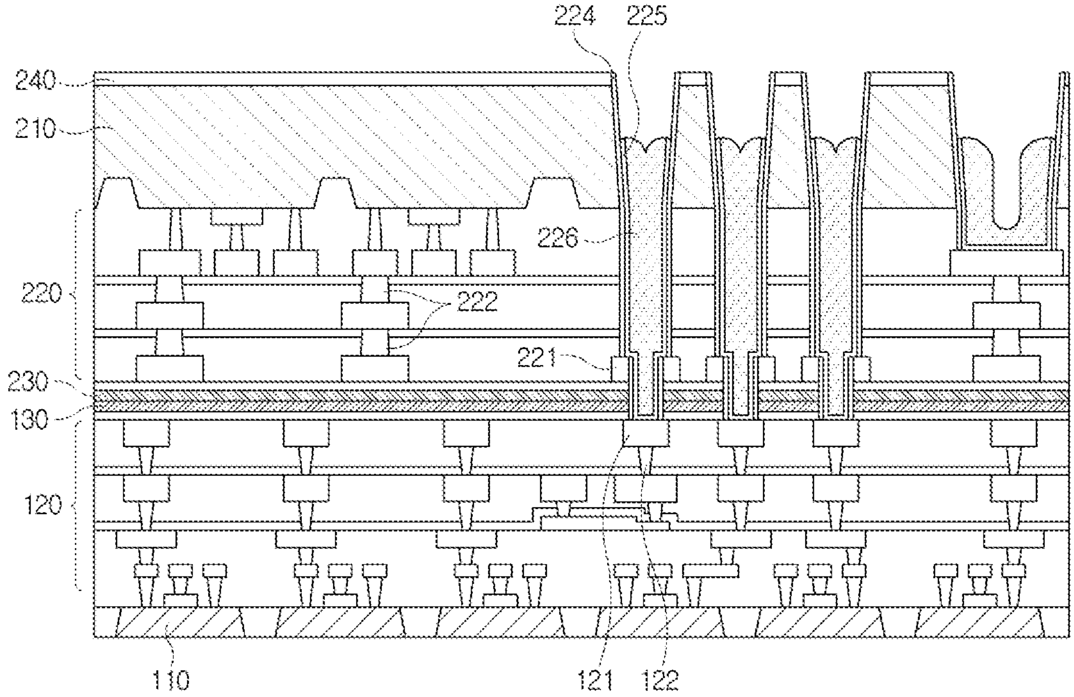

Referring to FIG. 14, after forming the contact plug 226, the amorphous carbon layer 260 may be removed, and the seed copper (Cu) and the barrier metal layer 225 formed in an upper region of the second substrate 210, among the barrier metal layer 225, may be removed.

Figure 15:
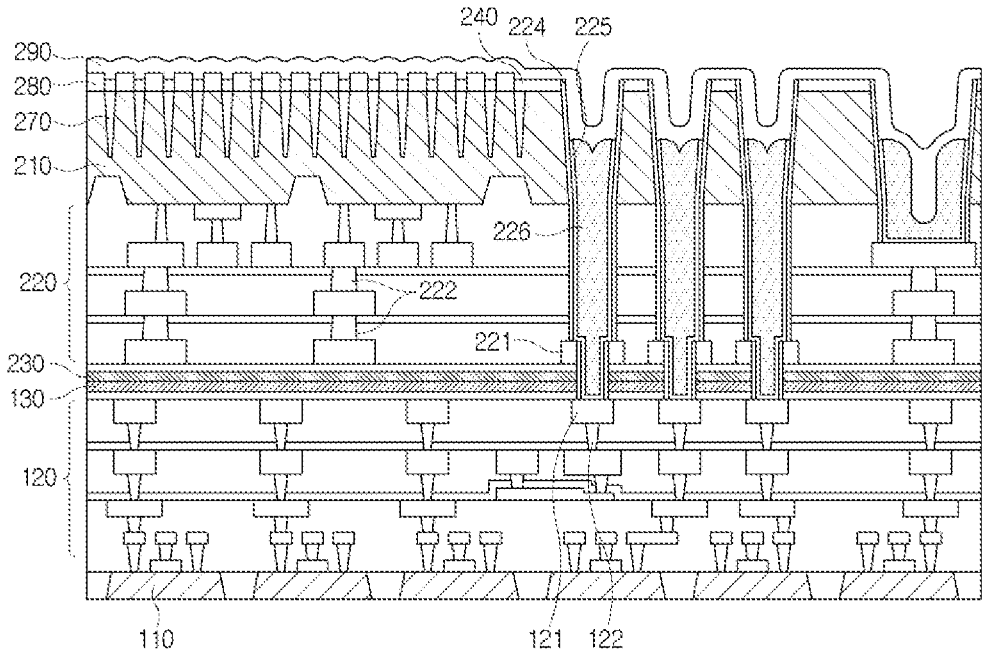

Referring to FIG. 15, after removing the barrier metal layer 225, the pixel array including the photodiode (not illustrated), a isolation layer (deep trench isolation layer, DTI) 270, a color filter 280, and the microlens 290 may be formed on the second substrate 210.

Referring to FIGS. 2, 4, 5, 6, and 15, the semiconductor device according to an embodiment may include the first semiconductor structure 100, and the second semiconductor structure 200.

The first semiconductor structure 100 may be formed on the first substrate 110, and may include the first wiring layer 120 including the plurality of first metal wirings 121 and the plurality of first vias 122, and the first bonding isolation layer 130 formed on the first wiring layer 120.

Before bonding to the first semiconductor structure 100, the second semiconductor structure 200 may form the dummy plug D in a vertical direction in one region of the second wiring layer 220, form the punch hole H1 vertically penetrating the second metal wiring 221, the second metal wiring 221 being formed on the dummy plug D, and form the dummy plug D additionally in an internal space of the punch hole H1.

The second semiconductor structure 200 may include the second bonding isolation layer 230 bonded to the first bonding isolation layer 130, the second wiring layer 220 formed on the second bonding isolation layer 230 and including the plurality of second metal wirings 221 and the plurality of second vias 222, and the second substrate 210 formed on the second wiring layer 220. The second semiconductor structure 200 may include the contact plug 226 formed to penetrate the second substrate 210, the second wiring layer 220, the second bonding isolation layer 230, and the first bonding isolation layer 130.

The description regarding each configuration of the first semiconductor structure 100 and the second semiconductor structure 200 is the same as the above, thus the description thereof will be omitted.

Referring to FIGS. 2, 4, 5, 6, and 15, the semiconductor device according to an embodiment of the present disclosure may include a first semiconductor structure 100, a second semiconductor structure 200, a through electrode 226, and a metal pattern 225.

The first semiconductor structure 100 may include the first substrate 110, the first isolation layer 120 formed on the first substrate 110 and in which a plurality of first wiring structures 121 and 122 are embedded, and the first bonding isolation layer 130 formed on the first isolation layer 120.

The second semiconductor structure 200 may include the second substrate 210, the second isolation layer 220 formed below the second substrate 210 and in which a plurality of second wiring structures 221 and 222 are embedded, and the second bonding isolation layer 230 formed below the second isolation layer 220 and bonded to the first bonding isolation layer 130.

The through electrode 226 may be formed to penetrate the second substrate 210, the second isolation layer 220, the second bonding isolation layer 230, and the first bonding isolation layer 130, and the through electrode 226 may be connected to a first conductive pattern 121 formed on top of the first isolation layer 120.

The metal pattern 225 may be formed to surround at least a portion of a sidewall of a part of the through electrode 226 formed between the second substrate 210 and the second bonding isolation layer 230.

The first wiring structure may include a plurality of first conductive patterns 121 and the plurality of first vias 122. The second wiring structure may include a plurality of second conductive patterns 221 and the plurality of second vias 222.

The description regarding the first semiconductor structure 100, the second semiconductor structure 200, the through electrode 226, and the metal pattern 225 is the same as the above, thus the description thereof will be omitted.

According to the present disclosure, by disposing the dummy plug in one region of the upper wafer which requires the connection of the upper and lower wafers, removing the dummy plug during wafer bonding and TSV process, and forming a butting contact through an additional etching, it is possible to minimize the dimension restrictions when connecting metal wirings of the upper and lower wafers. In addition, by applying the dielectric bonding, the cost may be reduced compared with the case to which the hybrid bonding is applied.

While the present application contains many specifics, these should not be construed as limitations on the scope of any subject matter or of what may be claimed, but rather as descriptions of features that may be specific to particular embodiments of particular techniques. Certain features that are described in the present application in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples of the disclosed technology are described and other implementations, enhancements and variations can be made based on what is described and illustrated in the present application.

What is claimed is:

1. A method for manufacturing a semiconductor device, comprising:

forming a first semiconductor structure comprising a logic transistor;

forming a second semiconductor structure;

bonding the first semiconductor structure to the second semiconductor structure, wherein forming the first semiconductor structure comprises:

forming a first substrate;

forming a first wiring layer comprising a plurality of first metal wirings and a plurality of first vias on the first substrate;

forming a first bonding isolation layer on the first wiring layer, wherein forming the second semiconductor structure comprises:

forming a second substrate;

forming a second wiring layer comprising a plurality of second metal wirings and a plurality of second vias on the second substrate;

forming a plurality of dummy plugs in the second wiring layer, forming a plurality of holes vertically penetrating the second substrate to a section in which the plurality of dummy plugs form, wherein the plurality of holes form after bonding the first semiconductor structure to the second semiconductor structure; and removing the plurality of dummy plugs.

2. The method for manufacturing a semiconductor device of claim 1, wherein the forming the plurality of dummy plugs comprises forming the plurality of dummy plugs in a vertical direction from an upper part of the second wiring layer to an upper part of the second substrate.

3. The method for manufacturing a semiconductor device of claim 2, further comprising:

forming a plurality of second metal wirings in an upper part of the second wiring layer comprising an upper region of the plurality of dummy plugs, and forming a plurality of punch holes vertically penetrating the plurality of second metal wirings formed in the upper region of the plurality of dummy plugs.

4. The method for manufacturing a semiconductor device of claim 3, further comprising:

forming a plurality of dummy plugs additionally in an internal space of the punch holes of the second semiconductor structure.

5. The method for manufacturing a semiconductor device of claim 4, further comprising:

forming a second bonding isolation layer on the second wiring layer after forming the plurality of dummy plugs additionally in the internal space of the punch holes of the second semiconductor structure.

6. The method for manufacturing a semiconductor device of claim 5, wherein the bonding the first semiconductor structure to the second semiconductor structure comprises bonding the first bonding isolation layer to the second bonding isolation layer.

7. The method for manufacturing a semiconductor device of claim 6, further comprising:

forming a plurality of third vias by etching a first capping nitride layer, the first bonding isolation layer, and the second bonding isolation layer formed on the plurality of first metal wirings after removing the plurality of dummy plugs.

8. The method for manufacturing a semiconductor device of claim 7, further comprising:

forming a spacer oxide layer on a sidewall of the plurality of third vias.

9. The method for manufacturing a semiconductor device of claim 8, further comprising:

etching the spacer oxide layer formed on a boundary plane between the plurality of third vias and the plurality of first metal wirings.

10. The method for manufacturing a semiconductor device of claim 9, further comprising:

forming a barrier metal layer on the second substrate, the spacer oxide layer, and the plurality of first metal wirings.

11. The method for manufacturing a semiconductor device of claim 10, further comprising:

forming an amorphous carbon layer on the barrier metal layer.

12. The method for manufacturing a semiconductor device of claim 11, further comprising:

forming a plurality of contact plugs inside the plurality of third vias after the amorphous carbon layer is formed.

13. The method for manufacturing a semiconductor device of claim 12, further comprising:

removing the amorphous carbon layer after the plurality of contact plugs are formed.

14. The method for manufacturing a semiconductor device of claim 13, further comprising:

removing the barrier metal layer formed in an upper region of the second substrate, among the barrier metal layer after the amorphous carbon layer is removed.

15. The method for manufacturing a semiconductor device of claim 14, further comprising:

forming a pixel array on the second substrate after the barrier metal layer is removed.

16. The method for manufacturing a semiconductor device of claim 15, wherein the forming pixel array on the second substrate comprises a photodiode, an isolation layer, a color filter, and a microlens.

* * * * *